United States Patent
Liao et al.

(10) Patent No.: US 12,363,906 B2
(45) Date of Patent: Jul. 15, 2025

(54) 3D LATERAL PATTERNING VIA SELECTIVE DEPOSITION FOR FERROELECTRIC DEVICES

(71) Applicant: Taiwan Semiconductor Manufacturing Company, Ltd., Hsinchu (TW)

(72) Inventors: Song-Fu Liao, Taipei (TW); Kuo-Chang Chiang, Hsinchu (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 472 days.

(21) Appl. No.: 17/867,983

(22) Filed: Jul. 19, 2022

(65) Prior Publication Data

US 2024/0032300 A1    Jan. 25, 2024

(51) Int. Cl.
| | |
|---|---|
| *H01L 51/10* | (2006.01) |
| *H10B 51/10* | (2023.01) |
| *H10B 51/20* | (2023.01) |
| *H10D 30/01* | (2025.01) |
| *H10D 30/69* | (2025.01) |
| *H10D 64/68* | (2025.01) |

(52) U.S. Cl.
CPC ............ *H10B 51/20* (2023.02); *H10B 51/10* (2023.02); *H10D 30/0415* (2025.01); *H10D 30/701* (2025.01); *H10D 64/689* (2025.01)

(58) Field of Classification Search
CPC ........ H10B 51/20; H10B 51/10; H10B 51/30; H10D 30/0415; H10D 30/701; H10D 64/689

USPC .......................................................... 257/295
See application file for complete search history.

(56) References Cited

U.S. PATENT DOCUMENTS

| | | | | |
|---|---|---|---|---|
| 5,874,755 A | * | 2/1999 | Ooms ................... | H10D 30/701 257/295 |
| 5,892,255 A | * | 4/1999 | Evans, Jr. .............. | H10D 1/692 257/295 |
| 11,404,099 B1 | * | 8/2022 | Wang .................... | G11C 11/223 |

(Continued)

OTHER PUBLICATIONS

Love et al. "Self-Assembled Monolayers of Thiolates on Metals as a Form of Nanotechnology" Chem. Rev. 2005, 105, 1103-1169, published on Mar. 25, 2005.

(Continued)

*Primary Examiner* — Sheikh Maruf
(74) *Attorney, Agent, or Firm* — Eschweiler & Potashnik, LLC

(57) ABSTRACT

In some embodiments, the present disclosure relates to a 3D memory device, including a plurality of gate lines interleaved between a plurality of dielectric layers in a vertical direction, the plurality of gate lines forming recesses between the plurality of dielectric layers; a source/drain line disposed next to the plurality of dielectric layers, spaced from the plurality of gate lines by the recesses in a lateral direction; a ferroelectric film arranged laterally between sidewalls of the plurality of gate lines and the source/drain line and confined within the recesses; and a semiconductor film disposed within the recesses and spacing the ferroelectric film from the source/drain line.

20 Claims, 12 Drawing Sheets

(56) References Cited

U.S. PATENT DOCUMENTS

| | | |
|---|---|---|
| 2015/0303174 A1* | 10/2015 | Yu .................. H01L 21/565 |
| | | 438/109 |
| 2019/0148330 A1* | 5/2019 | Chen ............. H01L 23/5384 |
| | | 257/774 |
| 2021/0408047 A1 | 12/2021 | Wang et al. |
| 2022/0028930 A1 | 1/2022 | Wu et al. |
| 2022/0052060 A1 | 2/2022 | Young et al. |
| 2022/0085060 A1 | 3/2022 | Narasaki et al. |
| 2022/0189993 A1 | 6/2022 | Tirukkonda et al. |
| 2022/0190030 A1 | 6/2022 | Majhi et al. |
| 2022/0238537 A1* | 7/2022 | Dowben ............ H10D 64/689 |
| 2022/0238539 A1* | 7/2022 | Lee .................. H10D 64/667 |
| 2022/0238690 A1* | 7/2022 | Chen .................. H10D 1/692 |
| 2022/0254900 A1* | 8/2022 | Yang ................. H10D 30/701 |
| 2022/0262805 A1* | 8/2022 | Tomita ................ H10B 41/35 |
| 2022/0278001 A1* | 9/2022 | Calabrese ........... H10D 30/025 |
| 2022/0278131 A1* | 9/2022 | Lee ................... H10B 51/10 |
| 2022/0285384 A1* | 9/2022 | Yang ................. H10B 43/20 |

OTHER PUBLICATIONS

Zhang et al. "Rapid and Selective Deposition of Patterned Thin Films on Heterogeneous Substrates via Spin Coating" ACS Appl. Mater. Interfaces 2019, 11, 23, 21177-21183, published on May 22, 2019.

* cited by examiner

3D LATERAL PATTERNING VIA SELECTIVE DEPOSITION FOR FERROELECTRIC DEVICES

BACKGROUND

Many modern day electronic devices include non-volatile memory. Non-volatile memory is electronic memory that is able to store data in the absence of power. A promising candidate for the next generation of non-volatile memory is ferroelectric field effect transistors (FeFET). FeFET has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
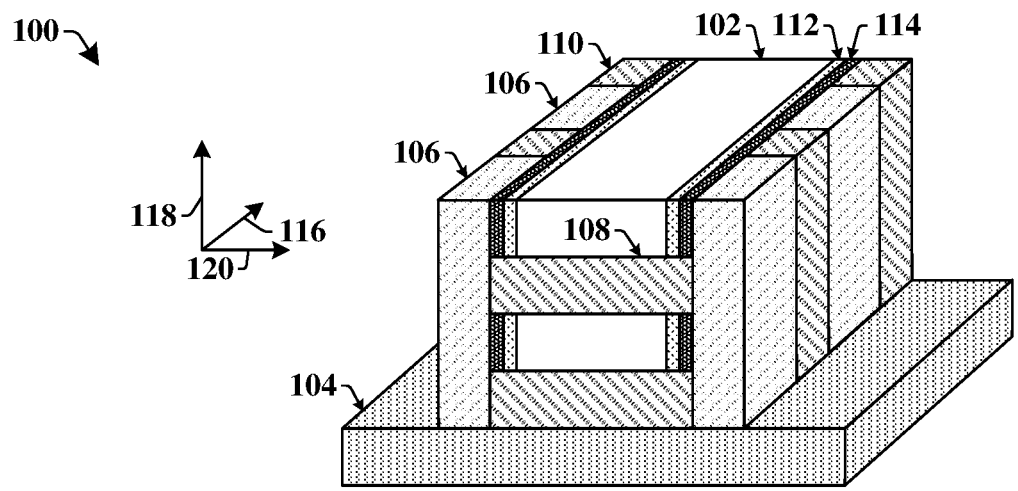
FIG. 1 illustrates a perspective view of some embodiments of a 3D memory device having a ferroelectric field effect transistor (FeFET) comprising a ferroelectric film recessed from source/drain lines.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric field effect transistor (FeFET) device includes a ferroelectric material arranged along a gate of a field effect transistor. The gate is separated from a channel that extends between a source and a drain. Either the channel or the dielectric may comprise the ferroelectric material. In recent years, FeFETS have been implemented as an 3D memory device that reads, writes, and stores data using polarized fields.

A 3D FeFET device may be formed by forming a gate stack comprising a plurality of gate lines interleaved with a plurality of dielectric layers. A ferroelectric film is formed along sidewalls of the plurality of gate lines and the plurality of dielectric layers, and a semiconductor film is formed to surround the ferroelectric film. Source/drain lines are then formed at spaced points along sidewalls of the semiconductor film. A voltage bias in the gate line may cause the semiconductor film to become locally conductive, connecting the source/drain lines with a conductive channel. Higher voltages may polarize the ferroelectric film to alter the threshold voltage of the semiconductor film and thereby store a data state within the ferroelectric film.

When forming 3D FeFET devices, the ferroelectric film and the semiconductor film may be formed to vertically extend across several closely packed gate lines. As technologies get smaller and more compact, the ferroelectric film and the semiconductor film are exposed to more potential damage and charge injection due to etching processes, plasma treatments and thermal processes applied in the formation of the source/drain lines and other features. These damaging effects may increase the leakage between the source/drain lines.

In the present disclosure, a method of selective deposition is presented to produce FeFET devices with less leakage. The method selectively forms the ferroelectric film and the semiconductor film on sidewalls of a plurality of gate lines by forming a sacrificial self assembled monolayer (SAM) formed onto sidewalls of a plurality of dielectric layers. The sacrificial SAM is configured to prevent the formation the ferroelectric film and the semiconductor film along the sidewalls of the plurality of dielectric layers, so that the ferroelectric film and the semiconductor film are confined along the sidewalls of the plurality of gate lines. By confining the ferroelectric film and the semiconductor film along sidewalls of the plurality of gate lines, the ferroelectric film and the semiconductor film have smaller surface areas that can be exposed to damage during subsequent fabrication processes, thereby leading to less leakage within the films. The confinement of the ferroelectric film and the semiconductor film also leads to fewer defects and grain boundaries due to increased process control.

FIG. 1 illustrates a perspective view 100 of some embodiments of a 3D memory device having a ferroelectric field effect transistor (FeFET) comprising a ferroelectric film 112 recessed from source/drain lines 106.

As shown in the perspective view 100 of FIG. 1, a plurality of gate lines 102 extend over a substrate 104 in a first lateral direction 116. The plurality of gate lines 102 are stacked above one another in a vertical direction 118. Source/drain lines 106 extend vertically and surround the plurality of gate lines 102 in a second lateral direction 120. A plurality of dielectric layers 108 are interleaved with the plurality of gate lines 102. The plurality of dielectric layers 108 space the plurality of gate lines 102 vertically from one another. A plurality of dielectric columns 110 are between the source/drain lines 106 in the first lateral direction 116. The plurality of dielectric columns 110 extend vertically from a bottom of the plurality of dielectric layers 108 to a top of the plurality of dielectric layers 108.

A ferroelectric film 112 and a semiconductor film 114 are both arranged between the plurality of gate lines 102 and the source/drain lines 106 in the second lateral direction 120. The ferroelectric film 112 lines the sidewalls of the plurality of gate lines 102 and is spaced from the source/drain lines 106 by the semiconductor film 114.

The ferroelectric film 112 and the semiconductor film 114 are both separated into a plurality of strips that are vertically outside of the dielectric layers 108. In some embodiments, the plurality of strips that are confined within recesses arranged between adjacent ones of the plurality of dielectric layers 108. For example, first strips of the ferroelectric film 112 and the semiconductor film 114 are separated from second strips of the ferroelectric film 112 and the semiconductor film by one of the plurality of dielectric layers 108. In some embodiments, the plurality of strips are vertically confined between top and bottom surfaces of an associated one of the plurality of gate lines 102.

The spacing of the plurality of strips ensures that the ferroelectric film 112 and the semiconductor film 114 have reduced surface areas that are exposed to subsequent processing steps used in the manufacture of other components. For example, the spacing of the plurality of strips ensures that the ferroelectric film 112 and the semiconductor film 114 have reduced surfaces areas that are exposed to an etchant used to form a trench for the source/drain lines 106. Reducing the surface areas that are exposed to subsequent processing steps may reduce damage to the ferroelectric film 112 and the semiconductor film 114, and thereby mitigate a leakage between adjacent ones of the source/drain lines 106.

Figure 2A:
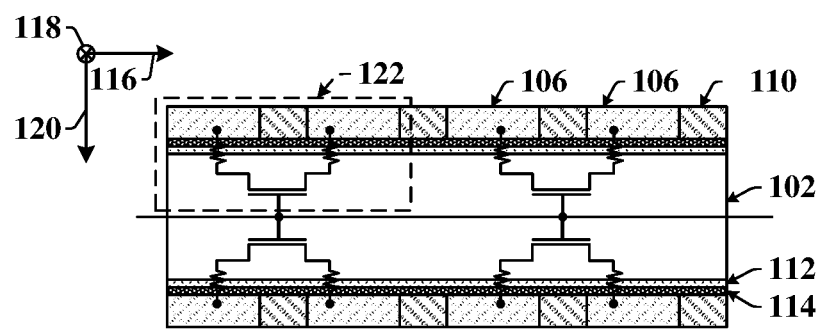
FIGS. 2A-2B illustrates a top down view and a circuit diagram of some additional embodiments of a 3D memory device having a ferroelectric field effect transistor (FeFET) comprising a ferroelectric film recessed from source/drain lines.
Figure 2B:
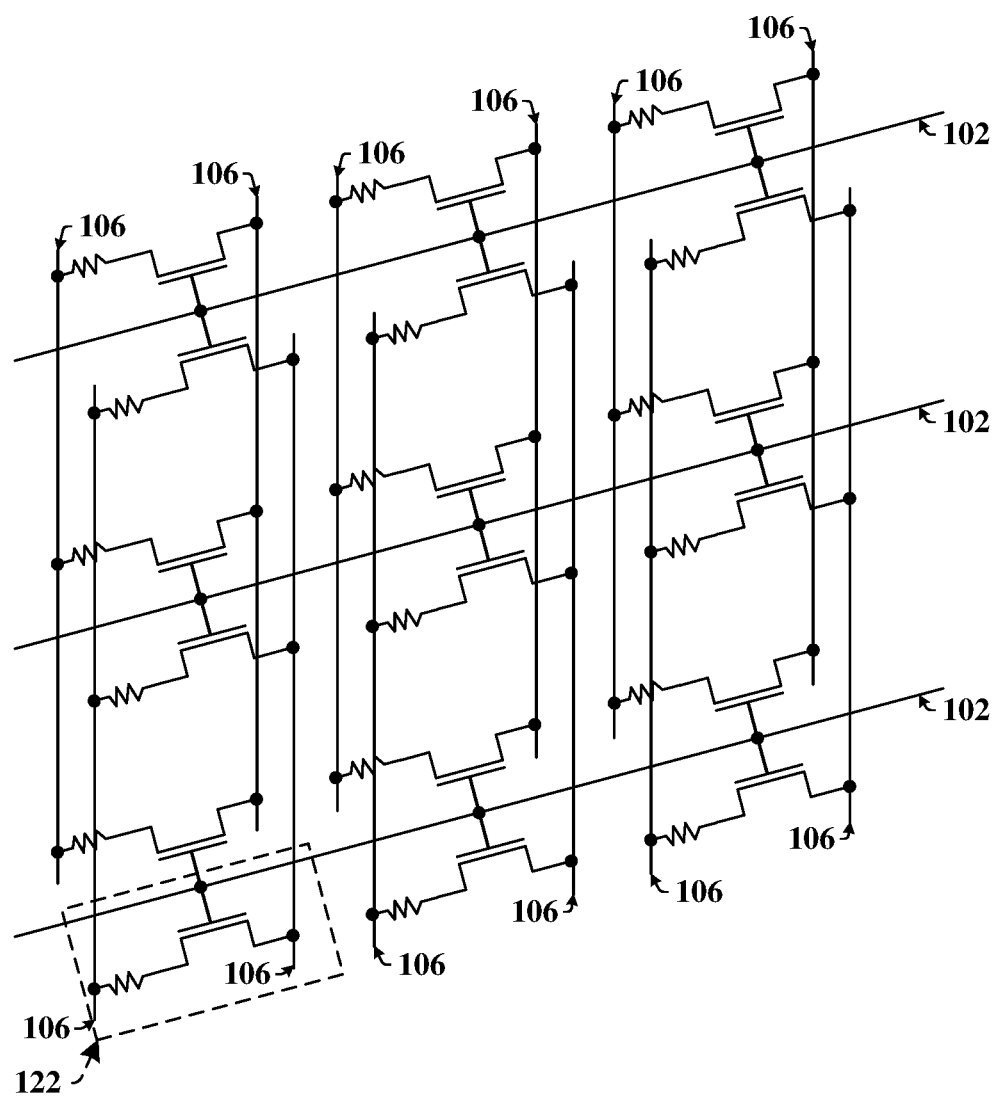

FIGS. 2A-2B illustrates a top down view 200a and circuit diagram 200b of some additional embodiments of a 3 D memory device having a ferroelectric field effect transistor (FeFET) comprising a ferroelectric film 112 recessed from the source/drain lines 106.

As shown in the top down view 200a of FIG. 2A, a FeFET device 122 comprises two source/drain lines 106, a gate line 102, a ferroelectric film 112 between the gate line 102 and the source/drain lines 106, and a semiconductor film 114 between the ferroelectric film 112 and the source/drain lines 106. In some embodiments, the ferroelectric film 112 is configured to act as a memory cell, and can be polarized in one of two different polarization directions.

For example, the polarization direction alters the voltage threshold of the semiconductor film 114, with a first polarization direction having a higher voltage threshold than a second polarization direction. The polarization direction is changed between the first polarization direction and the second polarization direction by applying a write voltage across the ferroelectric film 112 using the gate line 102 and the two source/drain lines 106. With the ability to change between the first polarization direction and the second polarization direction (and therefore the corresponding voltage thresholds), the FeFET device 122 can store a digital value (e.g., as a '1' or a '0'). The FeFET device 122 can be read by applying a read voltage to the gate line 102 that is between the voltage thresholds of the two different polarization directions, and measuring the current between the two source/drain lines 106. If the read voltage is greater than the voltage threshold, the semiconductor film 114 acts as a conductive channel between the two source/drain lines 106. If the read voltage is less than the voltage threshold of the FeFET device 122, no conductive channel is formed and a different current reading is attained. Because the plurality of gate lines 102 and the source/drain lines 106 intersect at different points, different addresses are available for individual FeFET devices of the 3 D memory device. In some embodiments, FeFET devices 122 are disposed on both sides of the plurality of gate lines 102, with the source/drain lines 106 perpendicular to and lining both sides of the plurality of gate lines 102.

As shown in the circuit diagram 200b of FIG. 2B, the intersection of the plurality of gate lines 102 and the source/drain lines 106 is shown as well. When performing read or write operations, a read voltage or a write voltage is applied to a gate line of the plurality of gate lines 102 corresponding to the FeFET device 122 to be read from or written to. During these operations, the source/drain lines 106 corresponding to the FeFET device 122 are also activated to perform the operation. As the source/drain lines 106 intersect each of the gate lines of the plurality of gate lines 102 once, each valid combination of the source/drain lines 106 and the gate lines of the plurality of gate lines 102 is a unique address with a specific FeFET device associated with it.

Figure 3A:
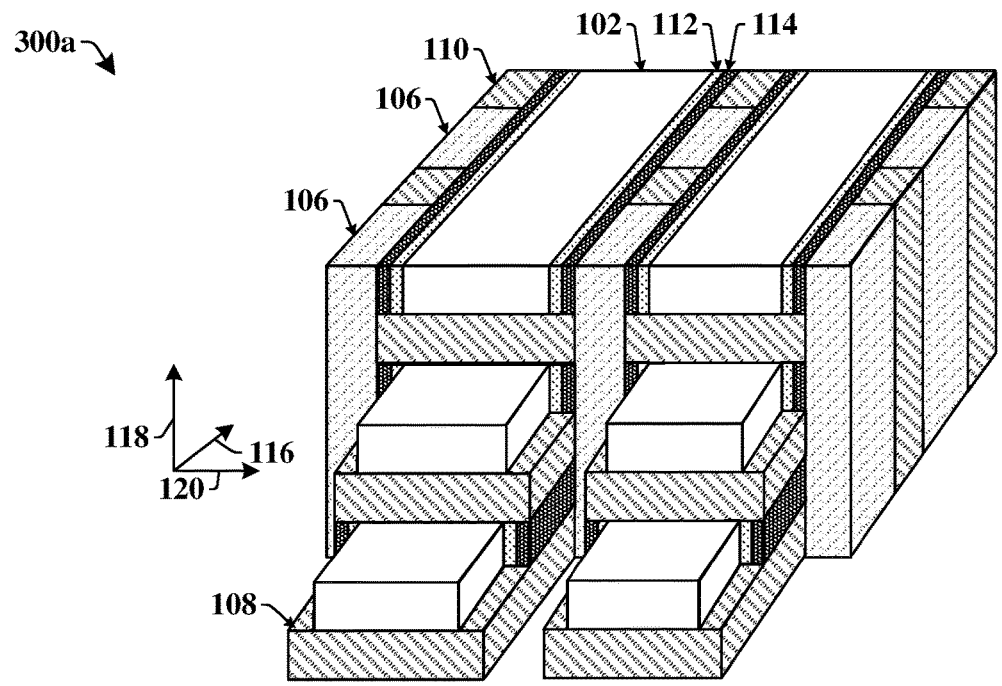
FIGS. 3A-3B illustrate a perspective view and a top down view of some additional embodiments of a 3D memory device having a ferroelectric field effect transistor (FeFET) comprising a ferroelectric film recessed from source/drain lines.
Figure 3B:
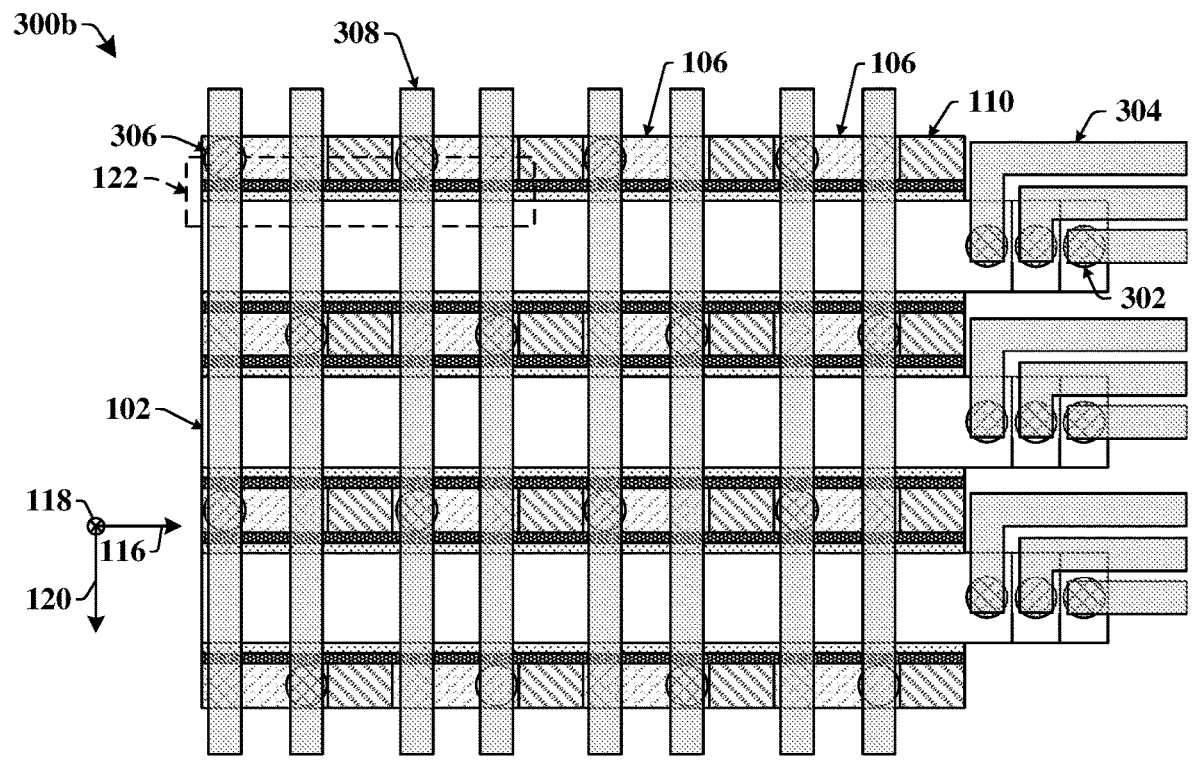

FIGS. 3A-3B illustrate a perspective view 300a and a top down view 300b of some additional embodiments of a 3 D memory device having a ferroelectric field effect transistor (FeFET) comprising a ferroelectric film recessed from the source/drain lines 106.

As shown in the perspective view 300a of FIG. 3A, the plurality of gate lines 102 may have a staircase configuration at one end, where a first gate line of the plurality of gate lines 102 will have a greater length than a gate line above the first gate line, and will have a shorter length than a gate line below the first gate line. The staircase configuration exposes upper surfaces of the gate lines below an uppermost gate line. In some embodiments, the ferroelectric film 112 and the semiconductor film 114 extends along the staircase configuration underneath the plurality of dielectric layers 108, as shown in FIG. 3A. In other embodiments, the ferroelectric film 112 and the semiconductor film 114 do not extend along the staircase configuration, and the plurality of dielectric layers 108 do not extend past the outer sidewalls of the plurality of gate lines 102 in the staircase configuration.

In some embodiments, the exposed upper surfaces of the plurality of gate lines 102 are electrically coupled to conductive contacts 302 as shown in the top down view 300b of FIG. 3B. The conductive contacts 302 are further coupled to a plurality of conductive lines 304, which connect the 3 D memory device to an underlying/overlying circuitry (e.g., control circuitry) and/or signal, power, and ground lines in the semiconductor die.

The source/drain lines 106 are coupled to source/drain conductive contacts 306 connecting to source/drain conductive lines 308. The source/drain conductive contacts 306 are placed such that source/drain lines 106 surrounding a gate line of the plurality of gate lines 102 in a second lateral direction 120 are not electrically coupled together. The source/drain conductive lines further connect to the underlying/overlying circuitry (e.g., control circuitry) and/or signal, power, and ground lines in the semiconductor die. In some embodiments, the source/drain conductive lines 308 extend in the second lateral direction 120. In some embodiments, the conductive lines 304 and the source/drain conductive lines 308 are both formed simultaneously at the same elevation above the 3 D memory device.

Figure 4A:
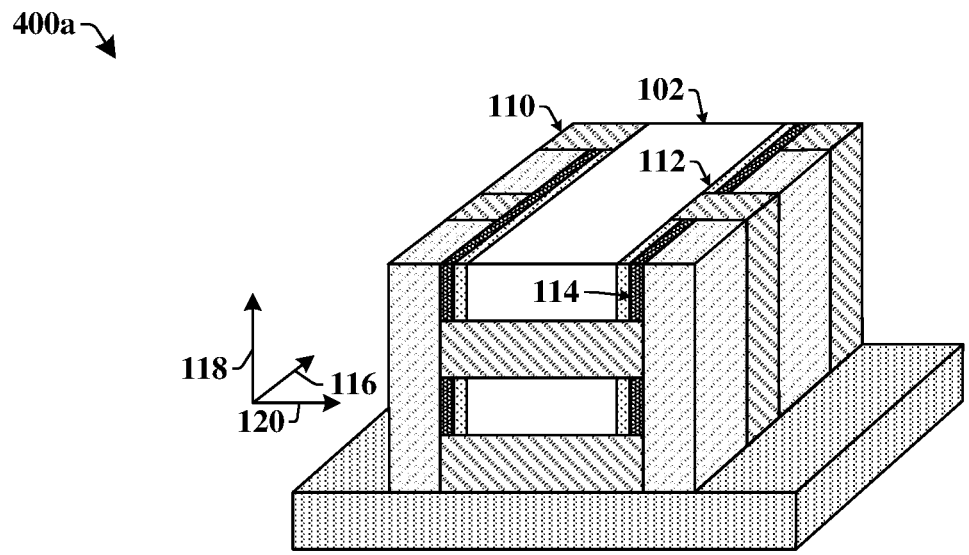
FIGS. 4A-4C illustrate perspective views of some additional embodiments of a 3D memory device having a ferroelectric field effect transistor (FeFET) comprising a ferroelectric film recessed from source/drain lines.
Figure 4B:
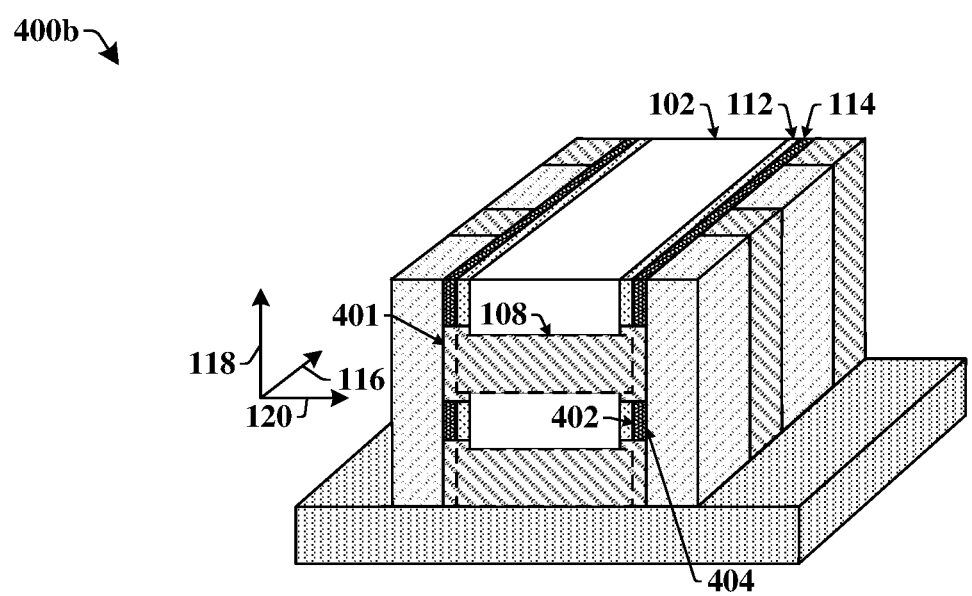
Figure 4C:
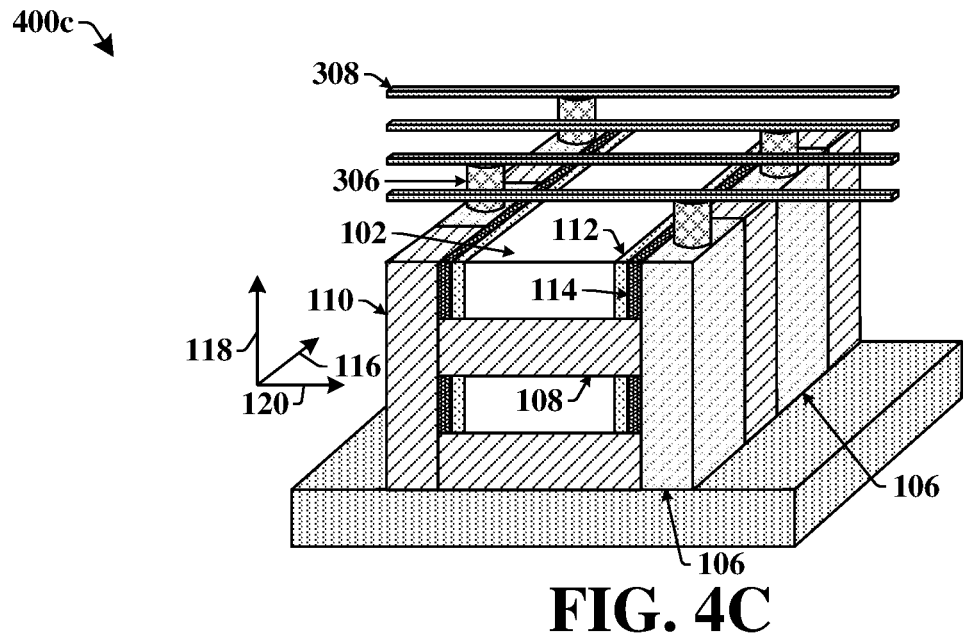

FIGS. 4A-4C illustrate perspective views 400a-400c of some additional embodiments of a 3 D memory device having a ferroelectric field effect transistor (FeFET) comprising a ferroelectric film 112 recessed from the source/drain lines 106.

As shown in the perspective view 400a of FIG. 4A, in some embodiments, the ferroelectric film 112 and the semiconductor film 114 may be laterally separated from one another (e.g., along first lateral direction 116) by the dielectric columns 110. The separation of the ferroelectric film 112 and semiconductor film 114 into discrete segments further isolates FeFET devices sharing a gate line, preventing another possible leakage path. The embodiment can be realized through lithography and etching processes after the ferroelectric film 112 and the semiconductor film 114 are formed.

As shown in the perspective view 400b of FIG. 4B, in some embodiments, the plurality of dielectric layers 108 may extend vertically past outer edges of sidewalls of the plurality of gate lines 102. The ferroelectric film 112 is centered on the sidewalls of the plurality of gate lines 102 and is flush with the inner sidewalls of the plurality of dielectric layers 108. The perspective view 400b shows dielectric caps 401 lining the plurality of dielectric layers 108 (shown in phantom). In some embodiments, the dielectric caps 401 and the plurality of dielectric layers 108 may comprise or be a same material. In other embodiments, the dielectric caps 401 and the plurality of dielectric layers 108 may comprise or be different materials. In some embodiments, the dielectric caps 401 are formed in a separate step from the plurality of dielectric layers 108. In some embodiments, a seam is arranged between the dielectric caps 401 and the plurality of dielectric layers 108. In other embodiments, the dielectric caps 401 are indistinguishable from the plurality of dielectric layers 108 and are substantially part of the plurality of dielectric layers 108. In some embodiments, the semiconductor film 114 comprises a plurality of strips on outer sidewalls of the ferroelectric film 112 including a first rectangular shaped strip. In further embodiments, a first sidewall 402 and a second sidewall 404 of the first rectangular shaped strip extends from a first dielectric layer of the plurality of dielectric layers 108 to a second dielectric layer of the plurality of dielectric layers 108.

As shown in the perspective view 400c of FIG. 4C, in some embodiments, the source/drain lines 106 surrounding a gate line of the plurality of gate lines 102 are offset from one another, such that each of the source/drain lines 106 are centered on one of the dielectric columns 110. For example, a first source/drain line arranged along a first side of the gate lines 102 has a center that is offset in a first lateral direction 116 from a center of a second source/drain line arranged along a second side of the gate lines 102. The configuration of the source/drain lines 106 may have source/drain conductive contacts 306 that are evenly spaced across the top of the 3 D memory device at a minimum distance necessary to maintain functionality, leading to greater efficiency in the use of space. Additionally, each source/drain conductive line 308 would extend directly above the dielectric columns on the opposing side of each of the plurality of gate lines 102, further isolating the two sets of FeFET devices.

Figure 5:
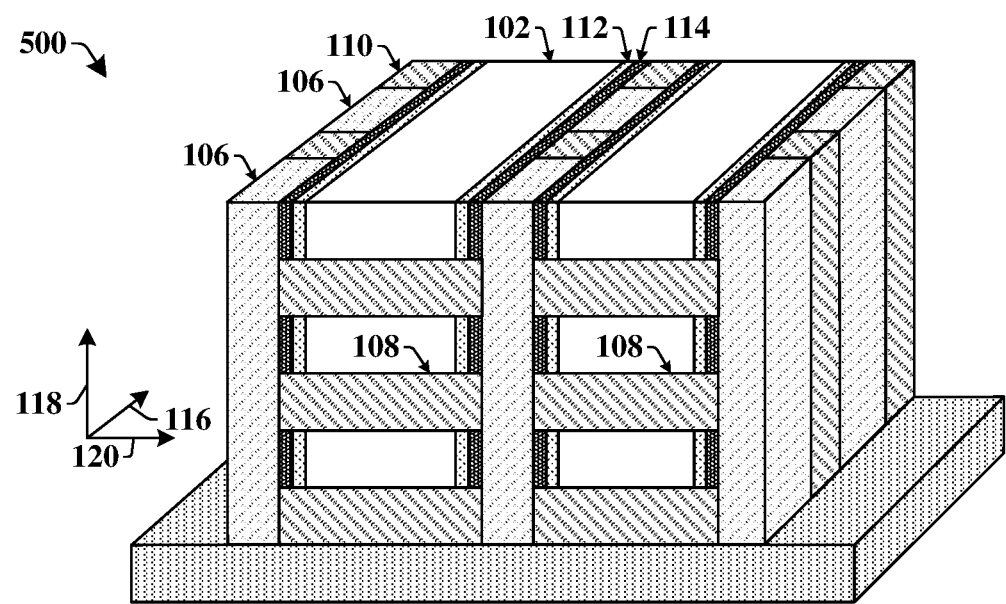
FIG. 5 illustrates a perspective view of some additional embodiments of a 3D memory device having a ferroelectric field effect transistor (FeFET) comprising a ferroelectric film recessed from source/drain lines.

FIG. 5 illustrates a perspective view 500 of some additional embodiments of a 3 D memory device having a ferroelectric field effect transistor (FeFET) comprising a ferroelectric film 112 recessed from the source/drain lines 106.

As shown in the perspective view 500 of FIG. 5, in some embodiments the gate lines of the plurality of gate lines 102 are parallel to one another and evenly spaced across the 3 D memory device in a plurality of rows and columns. The plurality of dielectric layers 108 are distributed between the plurality of gate lines 102 in a plurality of rows and columns. The source/drain lines 106 directly contact a semiconductor film 114 on two different columns of the plurality of gate lines 102.

The plurality of gate lines 102 comprises one of polysilicon, copper (Cu), titanium nitrate (TiN), tungsten (W), aluminum (Al), tantalum nitrate (TaN), a combination of one or more of the above, or the like. In some embodiments, the source/drain lines 106 may be the same material as the plurality of gate lines 102. In other embodiments, the source/drain lines 106 may be a different material than the plurality of gate lines 102. The plurality of dielectric layers 108 comprises silicon oxide, silicon oxynitride, or the like. In some embodiments, the dielectric columns 110 may be the same material as the plurality of dielectric layers 108. In other embodiments, the dielectric columns 110 may be a different material than the plurality of dielectric layers 108. The ferroelectric film 112 comprises one of hafnium zirconium oxide (HZO), aluminum scandium nitride (AlScN), aluminum yttrium nitride (AlYN), gallium scandium nitride (GaScN), indium scandium nitride (InScN), or the like. The semiconductor film 114 comprises one of zinc oxide (ZnO), zinc tin oxide (ZnTiO), indium tungsten oxide (InWO), indium gallium zinc oxide (InGaZnO, IGZO), indium zinc oxide (InZnO), indium tin oxide (ITO), combinations thereof, or the like. The substrate 104 comprises one of a bulk semiconductor, a semiconductor-on-insulator (SOI) substrate, or the like, which may be doped (e.g., with a p-type or an n-type dopant) or undoped.

FIGS. 6A, 6B, 7A, 7B, 9, 10, 11, 12, 13, and 14 illustrate perspective views of some embodiments of a method of forming a 3 D memory device having a ferroelectric field effect transistor (FeFET) comprising a ferroelectric film 112 recessed from the source/drain lines 106. Although FIGS. 6A, 6B, 7A, 7B, 9, 10, 11, 12, 13, and 14 are described in relation to a method, it will be appreciated that the structures disclosed in FIGS. 6A, 6B, 7A, 7B, 9, 10, 11, 12, 13, and 14 are not limited to such a method, but instead may stand alone as structures independent of the method.

Figure 6A:
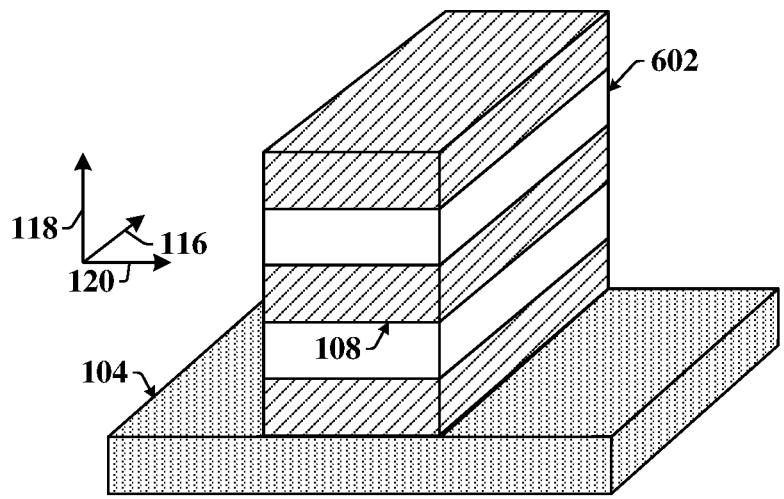
FIGS. 6A, 6B, 7A, 7B, 9, 10, 11, 12, 13, and 14 illustrate perspective views of some embodiments of a method of forming a 3D memory device having a ferroelectric field effect transistor (FeFET) comprising a ferroelectric film recessed from source/drain lines.

As shown in perspective view 600a of FIG. 6A, a plurality of conductive layers 602 and a plurality of dielectric layers 108 are formed over a substrate 104 and then etched into columns extending in the first lateral direction 116. The plurality of dielectric layers 108 are formed by, for example, chemical vapor deposition (CVD), physical vapor deposition (PVD), atomic layer deposition (ALD), some other process, or a combination of the foregoing. In some embodiments, the plurality of conductive layers 602 are formed by, for example, CVD, PVD, ALD, sputtering, electrochemical plating, electroless plating, some other deposition process, or a combination of the foregoing. In some embodiments, the process of forming the columns comprises forming a patterned masking layer (not shown) (e.g., positive/negative photoresist, a hardmask, etc.) on an upper surface of the plurality of dielectric layers 108. After the patterned masking layer is formed, an etching process removes unmasked portions of the plurality of dielectric layers 108 and the plurality of conductive layers 602, leaving columns such as the one shown in FIG. 6A. The etching process may be, for example, a wet etching process, a dry etching process (e.g., plasma dry etching), a reactive ion etching (RIE) process, some other etching process, or a combination of the foregoing.

Figure 6B:
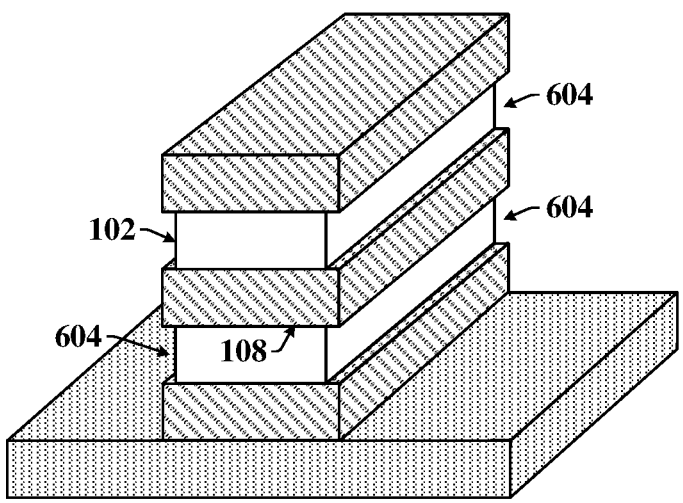

As shown in perspective view 600b of FIG. 6B, recesses 604 are formed between the plurality of dielectric layers 108 by etching sidewalls of the plurality of conductive layers 602 to form a plurality of gate lines 102. The sidewalls may be etched by, for example, a wet etching process (e.g., phosphoric acid), a reactive ion etching (RIE) process, some other etching process, or a combination of the foregoing. The recesses 604 extend between the plurality of dielectric layers 108 and span the exposed outer surfaces of the plurality of gate lines 102.

Figure 7A:
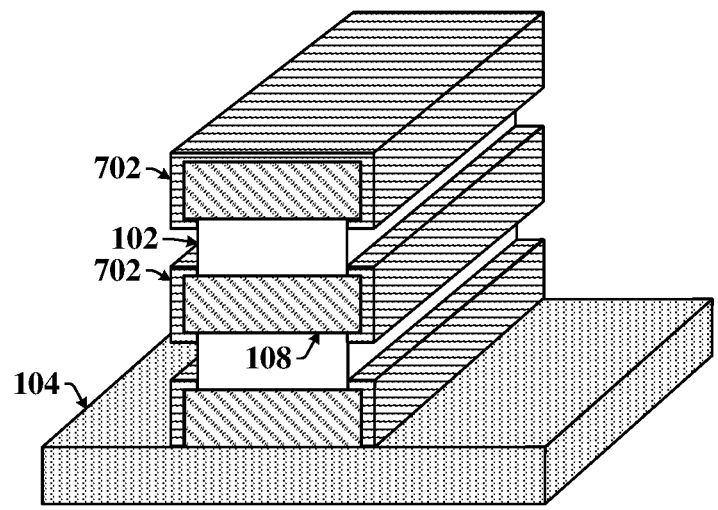
Figure 7B:
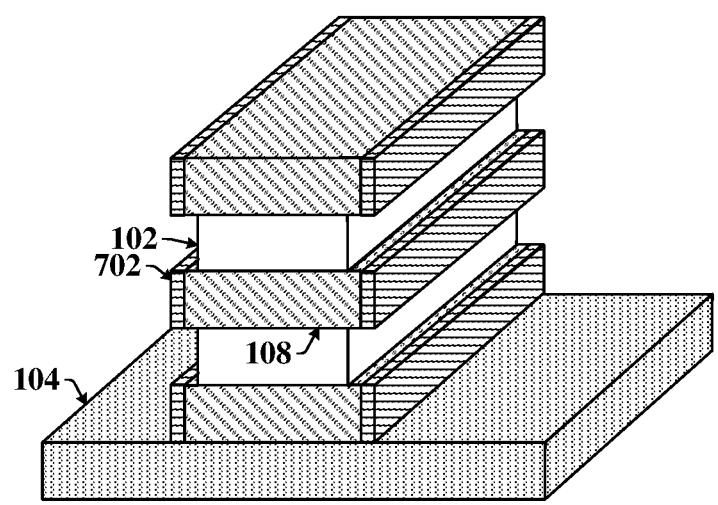

As shown in the perspective views 700a-700b of FIGS. 7A-7B, a self-assembled monolayer (SAM) 702 is formed over outer surfaces of the plurality of dielectric layers 108. In some embodiments, the SAM 702 is formed using a plurality of chemical baths, wherein the plurality of chemical baths comprise an immersion into a precursor solution (e.g., a 5 mM alkyltrichlorosilane solution (e.g., octadecyltrichlorosilane)) in toluene for 5 minutes, sonication in toluene for 3 minutes, an immersion in a first acetone chemical bath for 3 minutes, an immersion in acetic acid for 5 minutes, and an immersion in a second acetone chemical bath for 3 minutes to remove the residual unreacted alkyltrichlorosilane and impurities formed in the process. In some embodiments, SAM precursors other than alkyltrichlorosilane are used instead of or in combination with alkyltrichlorosilane in the precursor solution. In some embodiments, the SAM 702 is between 1 and 5 nanometers thick, between 0.25 and 2 nanometers thick, between 2.5 and 6 nanometers thick, or the like. In some embodiments, the SAM 702 is formed on outer surfaces of the plurality of dielectric layers 108 in discrete segments that are separated by distances bridging the outer surfaces of the plurality of gate lines 102.

The SAM 702 comprises a head group bonded to the plurality of dielectric layers 108, a spacer bonded to the head group and comprising a majority of the volume of the SAM 702, and a terminal functional group bonded to the ends of the spacer. The head group selectively bonds to the oxide materials, such as those forming the plurality of dielectric layers 108. The SAM 702 does not form along the plurality of gate lines 102.

The perspective view 700a of FIG. 7A shows the SAM 702 surrounding the exposed sidewalls of the plurality of dielectric layers 108 including above and below the plurality of dielectric layers 108. The perspective view 700b of FIG. 7B shows an alternative embodiment where the SAM 702 does not form above and below the plurality of dielectric layers 108 and is confined on sidewalls of the plurality of dielectric layers 108. In some embodiments, a portion of the SAM 702 that is above and below the plurality of dielectric layers 108 may have a lower thickness than a portion of the SAM 702 that is spanning the sidewalls of the plurality of dielectric layers 108. In some embodiments, the lower thickness is due to changes in the process of forming the SAM 702 increasing the coverage selectivity. In some embodiments, the SAM 702 may form across the exposed surfaces of the substrate 104, due to a thin native silicon oxide (e.g., $SiO_2$) layer.

Figure 8A:
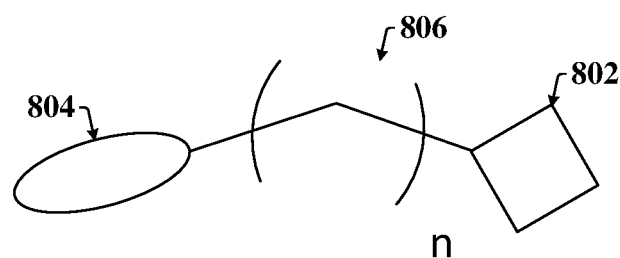
FIGS. 8A-8B illustrate some embodiments of chemical structures of a self-assembled monolayer used to select for specific areas to form a ferroelectric film.
Figure 8B:
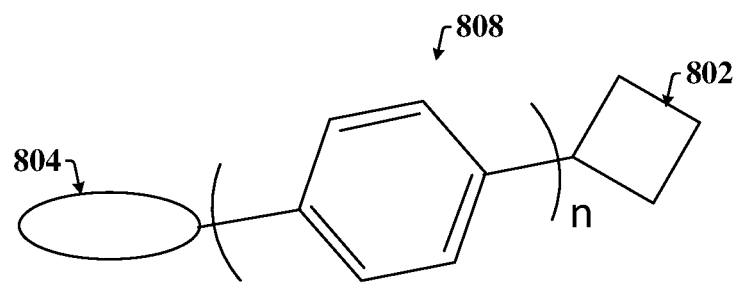

FIGS. 8A-8B illustrate some embodiments of chemical structures 800a, 800b of a self-assembled monolayer (SAM) 702 used to select for specific areas to form a ferroelectric film 112.

The SAM 702 has a head group 802, a terminal group 804, and a spacer 806, 808. The head group 802 is configured to bond to the dielectric layers. For example, the head group 802 may bond to oxide materials, such as silicon oxide and silicon oxynitride. In some embodiments, the head group of SAM precursors can be —$SiCl_3$ (trichlorosilane), —COOH (carboxyl acid), $SiX_3$ (X=H, $OCH_2CH_3$), or another suitable material. The terminal group 804 is on an opposite end of the SAM 702 as the head group, and does not bond to a metal, metal-like materials, or semiconductive materials of the disclosed gate layers. In some embodiments, the terminal group reacts to hydroxyl group (—OH) compounds within an oxide of the dielectric layers. In some embodiments, the terminal group 804 can be —$CH_3$, —$CF_3$, ethylene, acetylene, or another suitable material. The spacer 806, 808 is a hydrocarbon chain, and acts as a physical barrier between the material of the plurality of dielectric layers 108, the material of the ferroelectric film 112 and the material of the semiconductor film 114 as they are added. In chemical structure 800a shown in FIG. 8A, the spacer 806 is a straight or branch alkyl chain of a length n. In some embodiments, the length n of the straight or branch alkyl chain is between approximately 8 and approximately 20. In chemical structure 800b shown in FIG. 8B, the spacer 808 is a chain of aromatic rings of a length n. In some embodiments, the length n of the chain of aromatic rings is between approximately 1 and approximately 4. In some embodiments, the spacer 806, 808 is a combination of straight alkyl chains, branch alkyl chains, and aromatic rings. The combination of the lack of reactivity in the terminal group 804 and the physical barrier of the spacer 806, 808 ensure that the ferroelectric film 112 is not formed on the plurality of dielectric layers 108.

Figure 9:
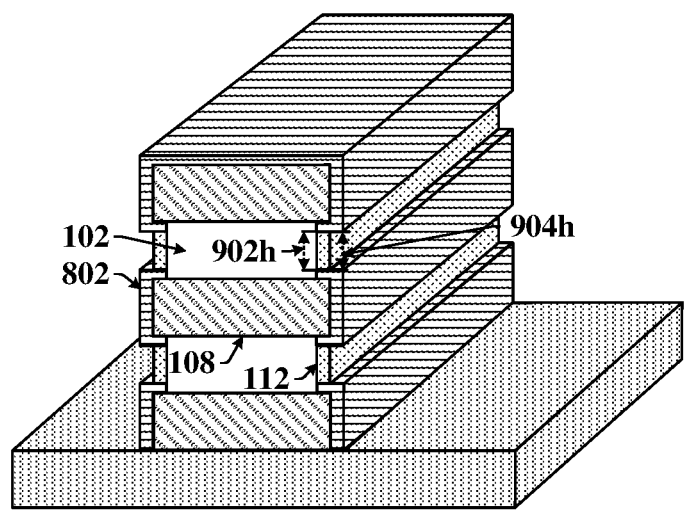

As shown in the perspective view 900 of FIG. 9, a ferroelectric film 112 is formed over the exposed surfaces of the plurality of gate lines 102. The ferroelectric film 112 is formed through chemical vapor deposition (CVD), physical vapor deposition (PVD), atomic layer deposition (ALD), or another suitable process. In some embodiments, the ferroelectric film 112 extends between upper and lower sidewalls of the SAM 702. In other embodiments, the ferroelectric film 112 extends between upper and lower sidewalls of the plurality of dielectric layers 108. In some embodiments, the ferroelectric film 112 is formed as a plurality of rectangular shaped strips recessed from outer sidewalls of the plurality of dielectric layers 108. In further embodiments, the plurality of rectangular shaped strips have a first sidewall 902 facing the plurality of gate lines 102 with a first height 902h and a second sidewall 904 facing away from the plurality of gate lines 102 with a second height 904h, and wherein the first height 902h and the second height 904h are substantially equal.

The ferroelectric film 112 is not formed over outer sidewalls of the SAM 702 due to bonding properties of the terminal group of the SAM 702. In some embodiments, the ferroelectric film 112 is vertically spaced from the plurality of dielectric layers 108 by the SAM 702 due to bonding properties of the terminal functional group of the SAM 702. Due to the narrowly defined area in which the ferroelectric film 112 is formed, the ferroelectric film 112 exhibits a lower number of defects and grain boundaries than in conventional FeFETs.

Figure 10:
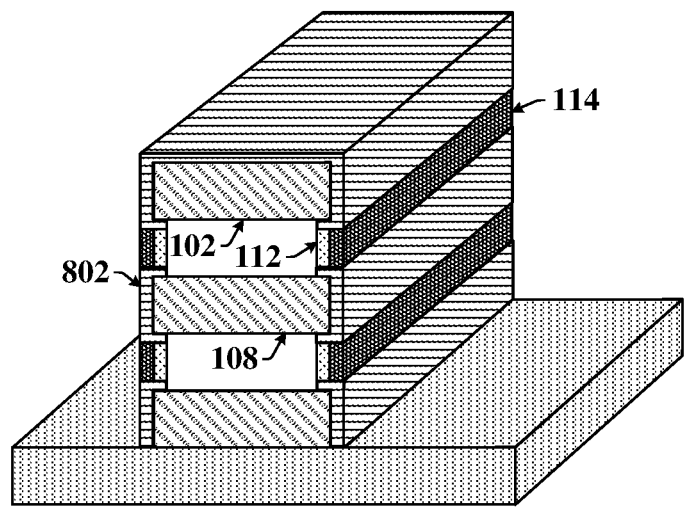

As shown in the perspective view 1000 of FIG. 10, a semiconductor film 114 is formed over the exposed outer surface of the ferroelectric film 112. The semiconductor film 114 is formed through chemical vapor deposition (CVD), physical vapor deposition (PVD), atomic layer deposition (ALD), or another suitable process. The semiconductor film 114 is not formed over outer sidewalls of the SAM 702 due to bonding properties of the terminal group of the SAM 702. In some embodiments, the semiconductor film 114 is vertically spaced from the plurality of dielectric layers 108 by the SAM 702. In some embodiments, the semiconductor film 114 is spaced from the plurality of gate lines 102 by the ferroelectric film 112.

Figure 11:
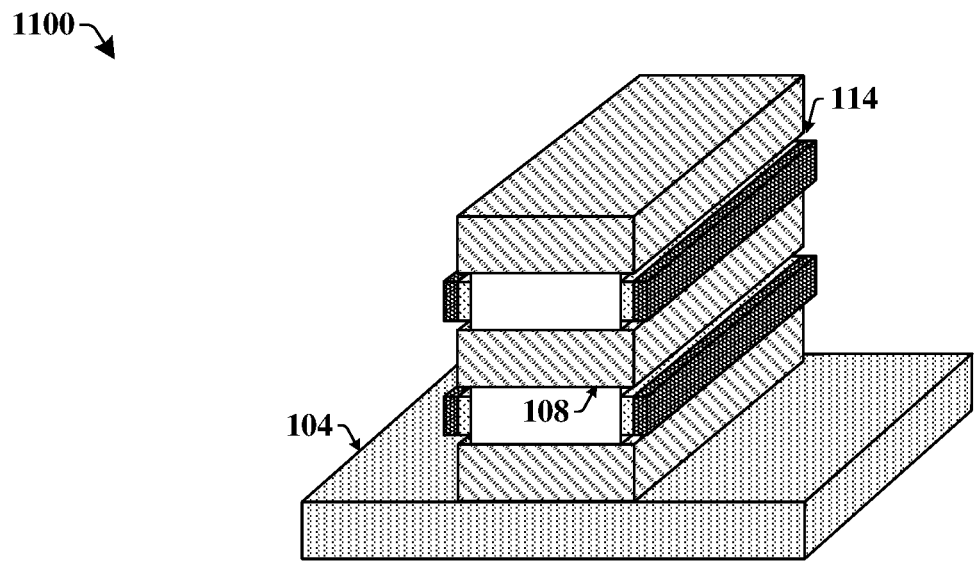

As shown in the perspective view 1100 of FIG. 11, the SAM 702 is removed. In some embodiments, the SAM 702 is removed using an oxygen plasma treatment. This removes the SAM 702 without damaging the plurality of dielectric layers 108, the ferroelectric film 112, or the semiconductor film 114. In some embodiments, the oxygen plasma treatment additionally fills in oxygen vacancies left in the ferroelectric film 112 and the semiconductor film 114 when these films comprise a metal oxide material. In some embodiments, the oxygen plasma treatment exposes the upper surface of the substrate 104 along with the outer surfaces of the plurality of dielectric layers 108.

Figure 12:
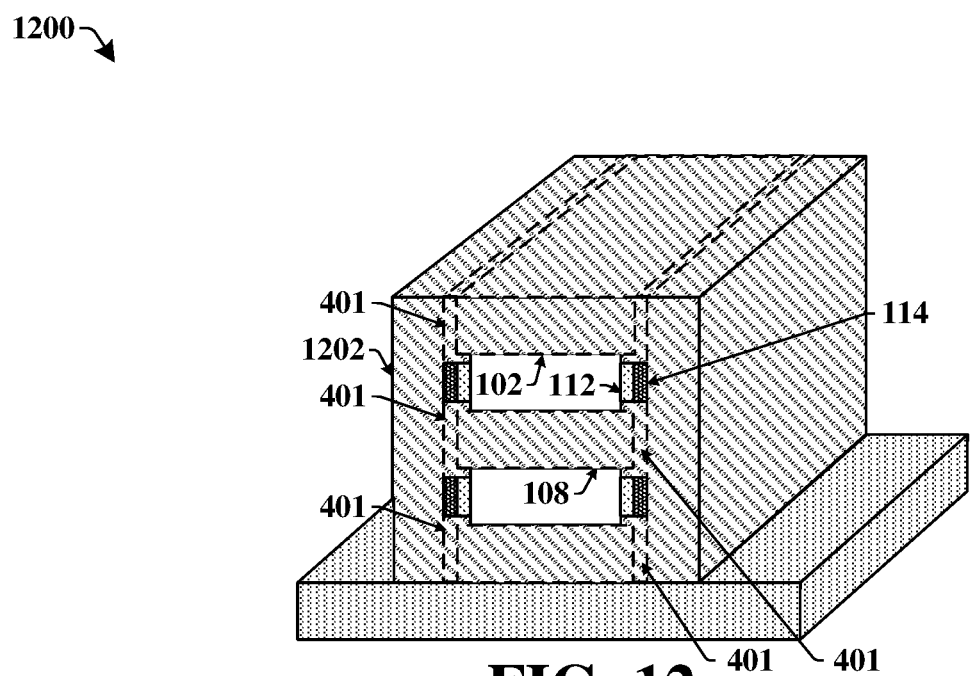

As shown in the perspective view 1200 of FIG. 12, a conformal dielectric 1202 is formed over outer sidewalls of the semiconductor film 114 and the outer sidewalls of the plurality of dielectric layers 108. In some embodiments, the conformal dielectric 1202 fills in gaps between the ferroelectric film 112 and the plurality of dielectric layers 108 left by the removal of the SAM (702 of FIG. 10), forming dielectric caps 401 extending to the plurality of gate lines 102. In some embodiments, the conformal dielectric 1202 fills the space between the columns comprising the plurality of dielectric layers 108 and the plurality of gate lines 102, extending laterally from a first gate line in a first column to a second gate line in a second column.

Figure 13:
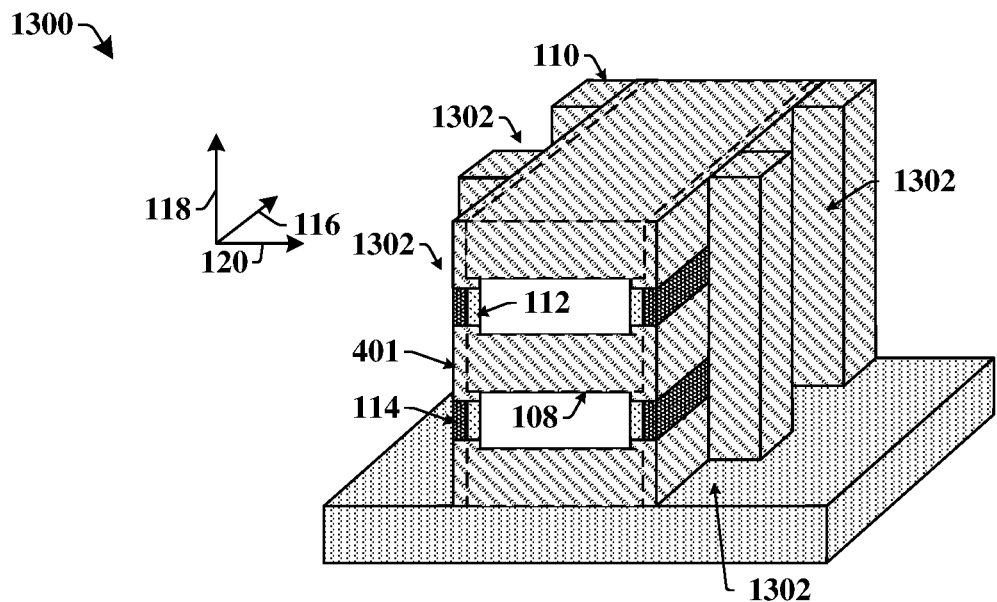

As shown in the perspective view 1300 of FIG. 13, source/drain holes 1302 are formed in the conformal dielectric 1202 leaving dielectric columns 110 spaced around the semiconductor film 114 and the plurality of dielectric layers 108. The holes are formed in a vertical direction 118 perpendicular to the first lateral direction 116 and extend to the upper surface of the substrate 104. In some embodiments, the dielectric caps 401 and semiconductor film 114 are exposed by the forming of the source/drain holes. In some embodiments, the second sidewall of the semiconductor film 114 are substantially aligned with (e.g., flush with) outer sidewalls of the dielectric caps 401. In some embodiments, the process of forming the source/drain holes 1302 comprises forming a patterned masking layer (not shown) (e.g., positive/negative photoresist, a hardmask, etc.) on an upper surface of the plurality of dielectric layers 108 and conformal dielectric (1202 of FIG. 12). After the patterned masking layer is formed, an etching process removes unmasked portions of the conformal dielectric 1202, leaving dielectric columns 110 such as the ones shown in FIG. 13. The etching process may be, for example, a wet etching process, a dry etching process (e.g., plasma dry etching), a reactive ion etching (RIE) process, some other etching process, or a combination of the foregoing.

Figure 14:
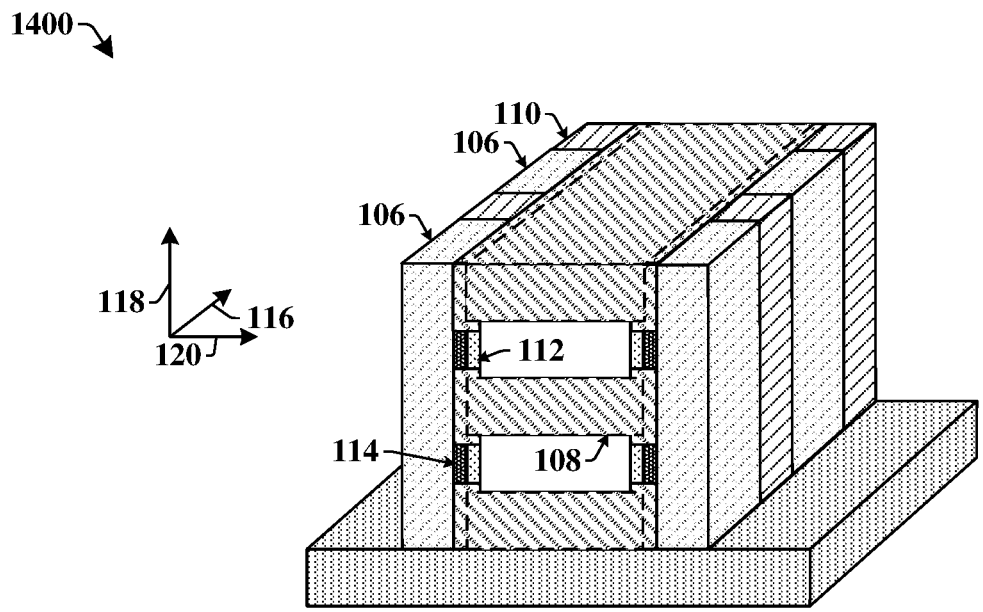

As shown in the perspective view 1400 of FIG. 14, source/drain lines 106 are formed within the source/drain holes 1302 extending in the vertical direction 118. The source/drain lines 106 are spaced from the plurality of gate lines 102 by the ferroelectric film 112 and the semiconductor film 114, and are spaced in the first lateral direction 116 by dielectric columns 110. The source/drain lines 106 are formed by filling the source/drain holes 1302 with a conductive material. In some embodiments, the source/drain lines 106 are formed by, for example, CVD, PVD, ALD, sputtering, electrochemical plating, electroless plating, some other deposition process, or a combination of the foregoing.

Figure 15:
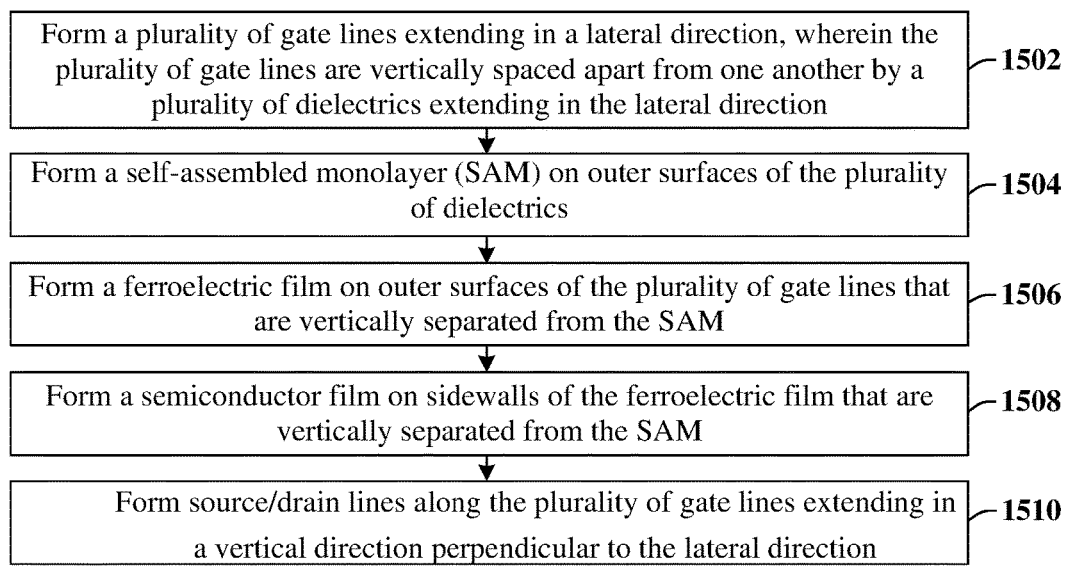
FIG. 15 illustrates a flow diagram of some embodiments of a method of forming a 3D memory device having a ferroelectric field effect transistor (FeFET) comprising a ferroelectric film recessed from source/drain lines.

FIG. 15 illustrates a flow diagram of some embodiments of a method 1500 of forming a 3 D memory device having a ferroelectric field effect transistor (FeFET) comprising a ferroelectric film 112 recessed from the source/drain lines 106.

While method 1500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a plurality of gate lines are formed extending in a lateral direction. The plurality of gate lines are vertically spaced apart from one another by a plurality of dielectric layers extending in the lateral direction. FIGS. 6A-6B illustrate perspective views 700a-700b of some embodiments corresponding to act 1502.

At 1504, a self-assembled monolayer (SAM) is formed on outer surfaces of the plurality of dielectric layers. FIGS. 7A-7B illustrate perspective views 800a-800b of some embodiments corresponding to act 1504.

At 1506, a ferroelectric film is formed on outer surfaces of the plurality of gate lines that are vertically outside of the SAM. FIG. 9 illustrates perspective view 900 of some embodiments corresponding to act 1506.

At 1508, a semiconductor film is formed on sidewalls of the ferroelectric film that are vertically outside of the SAM. FIG. 10 illustrates perspective view 1000 of some embodiments corresponding to act 1508.

At 1510, source/drain lines are formed along the plurality of gate lines extending in a vertical direction perpendicular to the lateral direction. FIG. 14 illustrates perspective view 1400 of some embodiments corresponding to act 1510.

Therefore, the present disclosure relates to a method of manufacturing FeFET devices that selectively forms ferroelectric films over gate lines to reduce leakage and defects due to the formation of the ferroelectric films and further process steps.

Accordingly, in some embodiments, the present disclosure relates to a 3 D memory device, including a plurality of gate lines interleaved between a plurality of dielectric layers in a vertical direction, the plurality of gate lines forming recesses between the plurality of dielectric layers; a source/drain line disposed next to the plurality of dielectric layers, spaced from the plurality of gate lines by the recesses in a lateral direction; a ferroelectric film arranged laterally between sidewalls of the plurality of gate lines and the source/drain line and confined within the recesses; and a semiconductor film disposed within the recess and spacing the ferroelectric film from the source/drain line.

In other embodiments, the present disclosure relates to a 3 D memory device, including: a plurality of gate lines extending over a substrate in a lateral direction; a plurality of dielectric layers spacing the plurality of gate lines from each other in a vertical direction perpendicular to the lateral direction; source/drain lines extending in the vertical direction along outer sidewalls of the plurality of dielectric layers; a ferroelectric film between the plurality of gate lines and a first source/drain line of the source/drain lines, the ferroelectric film having a sidewall facing the first source/drain line and being directly between an upper surface of a first dielectric of the plurality of dielectric layers and a lower surface of a second dielectric of the plurality of dielectric layers; and a semiconductor film covering the sidewall of the ferroelectric film.

In yet other embodiments, the present disclosure relates to method for forming a 3 D memory device, the method including forming a plurality of gate lines extending in a lateral direction, wherein the plurality of gate lines are vertically spaced apart from one another by a plurality of dielectric layers extending in the lateral direction; forming a self-assembled monolayer (SAM) on outer surfaces of the plurality of dielectric layers; forming a ferroelectric film on outer surfaces of the plurality of gate lines that are vertically outside of the SAM; forming a semiconductor film on sidewalls of the ferroelectric film that are vertically outside of the SAM; forming source/drain lines along the plurality of gates extending in a vertical direction perpendicular to the lateral direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a 3D memory device, the method comprising:
    forming a plurality of gate lines extending in a lateral direction, wherein the plurality of gate lines are vertically spaced apart from one another by a plurality of dielectric layers extending in the lateral direction;
    forming a self-assembled monolayer (SAM) on outer surfaces of the plurality of dielectric layers;
    forming a ferroelectric film on outer surfaces of the plurality of gate lines that are vertically separated from the SAM;
    forming a semiconductor film on sidewalls of the ferroelectric film that are vertically separated from the SAM; and
    forming source/drain lines along the plurality of gate lines extending in a vertical direction perpendicular to the lateral direction.

2. The method of claim 1, wherein the SAM is formed using alkyltrichlorosilane, and wherein the SAM is formed on outer surfaces of the plurality of dielectric layers in discrete segments that are separated by distances bridging the outer surfaces of the plurality of gate lines.

3. The method of claim 1, further comprising:
    forming the SAM using a plurality of chemical baths, wherein the plurality of chemical baths comprises an immersion into an alkyltrichlorosilane solution in toluene, sonication in toluene, an immersion in a first acetone chemical bath, an immersion in acetic acid, and an immersion in a second acetone chemical bath.

4. The method of claim 1, wherein the ferroelectric film and the semiconductor film are vertically spaced from the plurality of dielectric layers by the SAM due to bonding properties of a terminal functional group of the SAM.

5. The method of claim 1, wherein after the semiconductor film is deposited, the SAM is removed using an oxygen plasma treatment to ash the SAM.

6. The method of claim 1, further comprising:
    surrounding the semiconductor film with a conformal dielectric;
    removing portions of the conformal dielectric to form source/drain holes separated by a second plurality of dielectric layers; and
    filling the source/drain holes with a conductive material to form the source/drain lines.

7. The method of claim 1, wherein the SAM comprises:
    a head group that bonds to an oxide material in the plurality of dielectric layers,
    a spacer with a thickness of approximately 1 to 3 nanometers, and
    a terminal functional group that reacts with hydroxyl group (—OH) compounds.

8. A method for forming an integrated device, the method comprising: forming conductive layers and dielectric layers over a substrate,
    wherein the conductive layers are isolated from each other by the dielectric layers;
    etching the conductive layers and the dielectric layers to form columns extending in a first lateral direction and spaced in a second lateral direction perpendicular to the first lateral direction;
    etching the conductive layers to expose upper and lower surfaces of the dielectric layers;
    forming a self-assembled monolayer (SAM) on outer sidewalls of the dielectric layers;
    forming a ferroelectric film on exposed surfaces of the conductive layers;
    forming a semiconductor film on exposed surfaces of the ferroelectric film;
    forming a conformal dielectric covering the semiconductor film;
    etching the conformal dielectric to form openings extending in a vertical direction and exposing portions of the semiconductor film; and
    forming source/drain lines within the openings.

9. The method of claim 8, wherein the conductive layers have outer sidewalls facing the second lateral direction;
    wherein after forming the SAM, the SAM covers the exposed upper and lower surfaces of the dielectric layers and a first portion of the outer sidewalls of the conductive layers; and
    wherein after forming the ferroelectric film, the ferroelectric film is spaced from the dielectric layers by the SAM.

10. The method of claim 8, wherein the SAM is further formed on the upper and lower surfaces of the dielectric layers.

11. The method of claim 8, wherein the exposed surfaces of the ferroelectric film extend from a lower dielectric layer to an upper dielectric layer of the dielectric layers.

12. The method of claim 8, further comprising removing the SAM before forming the conformal dielectric, wherein the conformal dielectric contacts the outer sidewalls of the dielectric layers after being formed.

13. The method of claim 12, wherein forming the conformal dielectric results in the conformal dielectric contacting outer sidewalls of the conductive layers.

14. The method of claim 8, wherein after the conformal dielectric is etched, the openings are spaced in the first lateral direction by remaining portions of the conformal dielectric.

15. A method for forming an integrated device, the method comprising:
   forming a plurality of gate lines extending in a first lateral direction and spaced from each other by a plurality of dielectric layers in a vertical direction, wherein the plurality of gate lines have first outer sidewalls facing a second lateral direction perpendicular to the first lateral direction, and the plurality of dielectric layers have second outer sidewalls facing the second lateral direction;
   forming a ferroelectric film on the first outer sidewalls and between the second outer sidewalls, the ferroelectric film having third outer sidewalls facing the second lateral direction;
   forming a semiconductor film on the third outer sidewalls and between the second outer sidewalls, the semiconductor film having fourth outer sidewalls facing the second lateral direction;
   forming a conformal dielectric covering the fourth outer sidewalls and the second outer sidewalls;
   etching the conformal dielectric to form openings extending in the vertical direction and exposing portions of the fourth outer sidewalls; and
   forming source/drain lines within the openings.

16. The method of claim 15, further comprising:
   forming a self-assembled monolayer (SAM) on the second outer sidewalls after forming the plurality of gate lines, the SAM having fifth outer sidewalls facing the second lateral direction, wherein the fifth outer sidewalls remain exposed after forming the ferroelectric film and the semiconductor film; and
   removing the SAM before forming the conformal dielectric.

17. The method of claim 16, further comprising etching the plurality of gate lines, resulting in the first outer sidewalls being separated from the second outer sidewalls in the second lateral direction,
   wherein the SAM is also formed on upper and lower surfaces of the plurality of dielectric layers that are exposed in the etching of the plurality of gate lines, and
   wherein the SAM covers a portion of the first outer sidewalls, resulting in the ferroelectric film being spaced from the plurality of dielectric layers by the SAM after the ferroelectric film is formed.

18. The method of claim 15, wherein the ferroelectric film comprises a plurality of strips of ferroelectric material on the first outer sidewalls and separated by the second outer sidewalls in the vertical direction.

19. The method of claim 18, wherein after the source/drain lines are formed, a first source/drain line and a second source/drain line of the source/drain lines contact a first strip and a second strip of the plurality of strips.

20. The method of claim 15, wherein the conformal dielectric extends between the ferroelectric film and the plurality of dielectric layers.

* * * * *